United States Patent
Feng

(10) Patent No.: US 12,127,390 B2
(45) Date of Patent: Oct. 22, 2024

(54) METHOD FOR MANUFACTURING A SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Dawei Feng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 533 days.

(21) Appl. No.: 17/506,739

(22) Filed: Oct. 21, 2021

(65) Prior Publication Data

US 2022/0320099 A1 Oct. 6, 2022

Related U.S. Application Data

(63) Continuation of application No. PCT/CN2021/108815, filed on Jul. 28, 2021.

(30) Foreign Application Priority Data

Mar. 30, 2021 (CN) .......................... 202110342487.1

(51) Int. Cl.
H10B 12/00 (2023.01)

(52) U.S. Cl.
CPC .......... *H10B 12/30* (2023.02); *H10B 12/485* (2023.02); *H10B 12/488* (2023.02)

(58) Field of Classification Search
CPC .... H10B 12/30; H10B 12/485; H10B 12/488; H10B 12/482
See application file for complete search history.

(56) References Cited

U.S. PATENT DOCUMENTS

| | | | |
|---|---|---|---|
| 7,452,806 B2 | 11/2008 | Hwang | |
| 7,687,403 B2 | 3/2010 | Sim | |
| 7,776,750 B2 | 8/2010 | Kim | |
| 10,312,088 B1* | 6/2019 | Chang | ................. H01L 21/0335 |
| 2008/0026588 A1 | 1/2008 | Hwang | |
| 2008/0064216 A1 | 3/2008 | Sim | |
| 2008/0153299 A1 | 6/2008 | Kim | |
| 2021/0350834 A1* | 11/2021 | Ke | .......................... G11C 5/063 |
| 2022/0093608 A1* | 3/2022 | Ping | ..................... H10B 12/482 |

FOREIGN PATENT DOCUMENTS

| | | |
|---|---|---|
| CN | 1184682 C | 1/2005 |
| CN | 101118872 A | 2/2008 |
| CN | 101140883 A | 3/2008 |
| CN | 101207037 A | 6/2008 |
| CN | 111640747 A | 9/2020 |
| CN | 113097145 A | 7/2021 |

* cited by examiner

*Primary Examiner* — Brian Turner
*Assistant Examiner* — Nicholas B Michaud
(74) *Attorney, Agent, or Firm* — Kilpatrick Townsend & Stockton LLP

(57) ABSTRACT

Provided is a method for manufacturing a semiconductor structure and a semiconductor structure, and relates to the field of semiconductor technology. The method for manufacturing the semiconductor structure includes: providing a substrate, stacking and forming a bit line contact layer, a first mask layer, a second mask layer and a plurality of mask structures arranged spaced apart from each other in sequence on the substrate, and forming first openings between adjacent mask structures; and removing a part of the second mask layer exposed in the first openings so as to form first grooves in the second mask layer.

19 Claims, 18 Drawing Sheets

METHOD FOR MANUFACTURING A SEMICONDUCTOR STRUCTURE AND SEMICONDUCTOR STRUCTURE

CROSS-REFERENCE TO RELATED APPLICATIONS

This application is a continuation application of International Application No. PCT/CN2021/108815, filed on Jul. 28, 2021, which claims priority to Chinese Patent Application No. 202110342487.1, filed on Mar. 30, 2021. The disclosures of International Application No. PCT/CN2021/108815 and Chinese Patent Application No. 202110342487.1 are hereby incorporated by reference in their entireties.

BACKGROUND

A dynamic random access memory (DRAM for short) is a semiconductor memory that writes and reads data at high speed and randomly, and is widely used in data storage apparatuses or devices.

The dynamic random access memory is composed of a plurality of repeated memory cells. Each memory cell usually includes a capacitor structure and a transistor. The gate of the transistor is connected to the word line, the drain is connected to the bit line, and the source is connected to the capacitor structure. The bit line is usually connected to the drain through a bit line contact structure.

In the process of manufacturing bit line contact structures, loss of bit line contact structures may usually occur, so that some drains cannot be connected to bit line contact structures, which affects the storage performance of the semiconductor structure.

SUMMARY

This disclosure relates to the field of semiconductor technology, and in particular to a method for manufacturing a semiconductor structure and a semiconductor structure.

The first aspect according to embodiments of the disclosure provides a method for manufacturing a semiconductor structure, which includes the following operations.

A substrate is provided, in which a plurality of word lines are formed.

A bit line contact layer, a first mask layer and a second mask layer are stacked and formed in sequence on the substrate.

A plurality of mask structures arranged spaced apart from each other are formed on the second mask layer, in which first openings are formed between adjacent mask structures.

A part of the second mask layer exposed in the first openings is removed so as to form first grooves in the second mask layer.

A second opening, that exposes a top surface of the second mask layer, is formed in each of the mask structures.

The second mask layer exposed in the first groove and the second opening as well as a part of the first mask layer are removed so as to form first transition holes.

A filling layer is formed in each of the first transition holes.

The second mask layer and the first mask layer located between filling layers are removed so as to form second transition holes between adjacent filling layers, in which projections of the second transition holes on the substrate are respectively coincident with a corresponding one of the word lines.

The first mask layer and the bit line contact layer that are exposed in each of the second transition holes are removed, in which the remaining bit line contact layer forms a plurality of bit line contact structures arranged spaced apart from each other.

The second aspect according to the embodiments of the disclosure provides a method for manufacturing a semiconductor structure, which includes the following operations.

A substrate is provided, in which a plurality of word lines are formed.

A bit line contact layer, a first mask layer and a second mask layer are stacked and formed in sequence on the substrate, in which a thickness of the second mask layer is ⅖ to ⅗ of a thickness of the first mask layer.

A plurality of mask structures arranged spaced apart from each other are formed on the second mask layer, in which first openings between adjacent mask structures are formed;

A second opening, that exposes a top surface of the second mask layer, is formed in each of the mask structures.

The second mask layer exposed in the first opening and the second opening as well as a part of the first mask layer are removed so as to form first transition holes.

A filling layer is formed in each of the first transition holes.

The second mask layer and the first mask layer located between filling layers are removed so as to form second transition holes between adjacent filling layers, in which the projections of the second transition holes on the substrate are respectively coincident with a corresponding one of the word lines.

The first mask layer and the bit line contact layer that are exposed in each of the second transition holes are removed, in which the remaining bit line contact layer forms a plurality of bit line contact structures arranged spaced apart from each other.

The third aspect according to the embodiments of the disclosure provides a semiconductor structure, which is manufactured by the above method for manufacturing a semiconductor structure.

DETAILED DESCRIPTION

Figure 1:
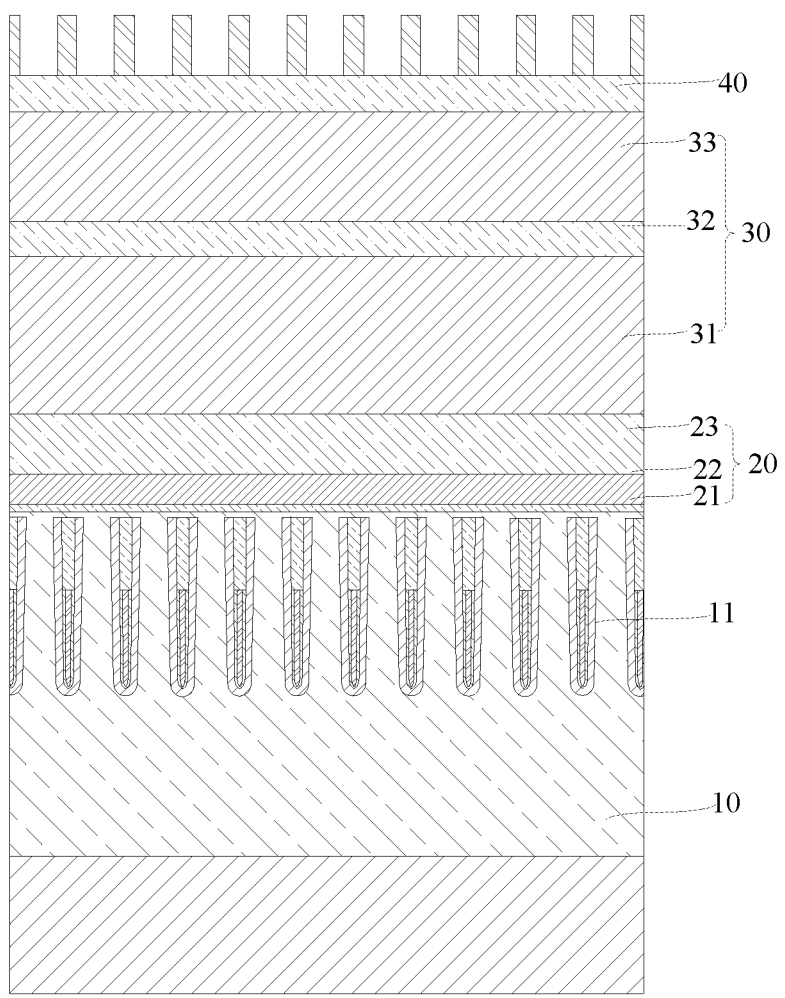
FIG. 1 illustrates a schematic structural diagram of patterning a second mask layer in a method for manufacturing a semiconductor structure in the related art.
Figure 2:
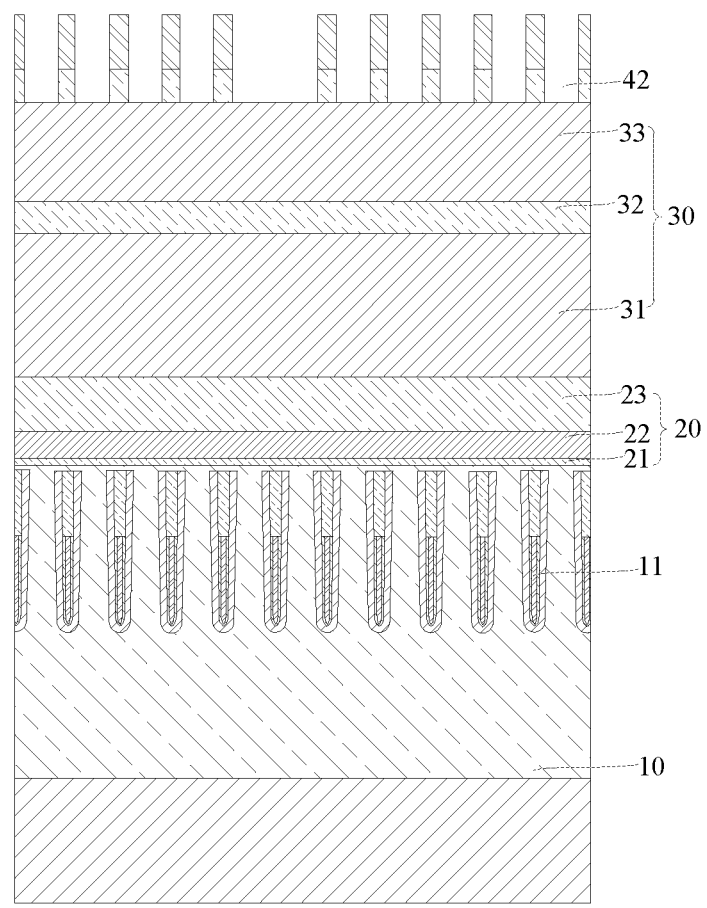
FIG. 2 illustrates a schematic structural diagram after patterning the second mask layer in the method for manufacturing a semiconductor structure in the related art.
Figure 3:
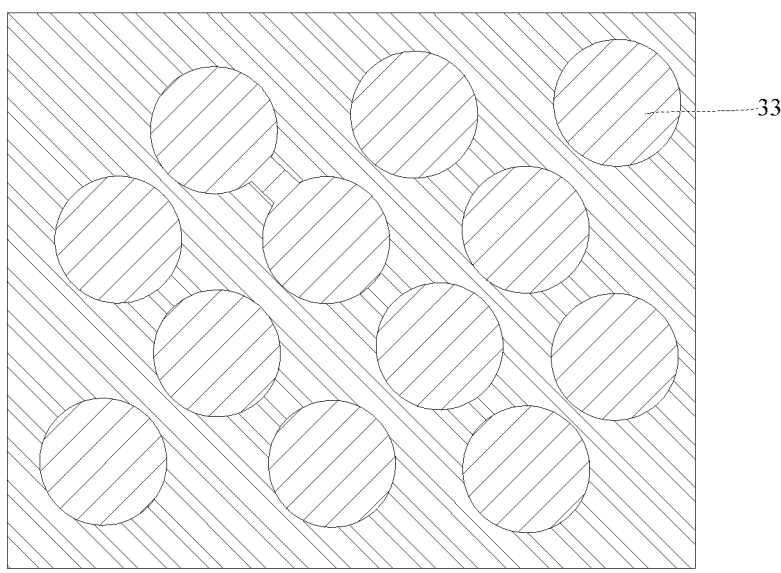
FIG. 3 illustrates a top view of FIG. 2.
Figure 4:
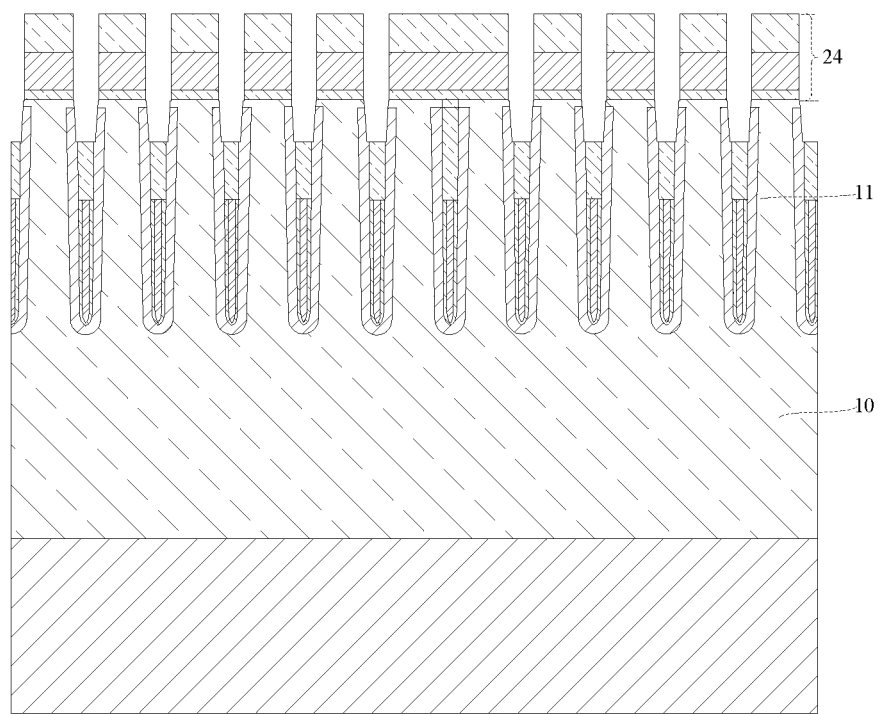
FIG. 4 illustrates a schematic diagram of forming a bit line contact structure in the method for manufacturing a semiconductor structure in the related art.

As shown in FIGS. 1 to 4, when a bit line contact structure is formed, a bit line contact layer 20, a first mask layer 30, and a second mask layer 40 are usually formed on a substrate 10, and then a mask pattern is formed on the second mask layer 40, and the second mask layer 40 is etched by using the mask pattern as a mask. However, when the second mask layer 40 is etched, the second mask layer 40 is easily laterally etched, so that etching holes 42 of different sizes are formed in the second mask layer 40. In this way, as the etching holes on the second mask layer 40 are then used as a mask to form bit line contact structures, the bit line contact structures are easy lost, such that some drains in the substrate may not be connected to bit line contact structures, which affects the storage performance of the semiconductor structure.

With respect to the above technical problem, in the method for manufacturing a semiconductor structure and the semiconductor structure provided in embodiments of this disclosure, by locally or overall thinning the second mask layer, the thickness of the second mask layer is reduced, the etching time for etching the second mask layer is reduced, and the lateral etching to the second mask layer is prevented, thereby avoiding the loss of the bit line contact structures and improving the storage performance of the semiconductor structure.

In order to make the above objectives, features, and advantages of the embodiments of this disclosure more obvious and understandable, the technical solutions in the embodiments of this disclosure will be described clearly and completely in combination with the drawings in the embodiments of this disclosure. Apparently, the described embodiments are only a part of the embodiments of this disclosure, rather than all embodiments. Based on the embodiments of the disclosure, any other embodiments obtained by those skilled in the art without creative effort shall fall within the protection scope of this disclosure.

Figure 5:
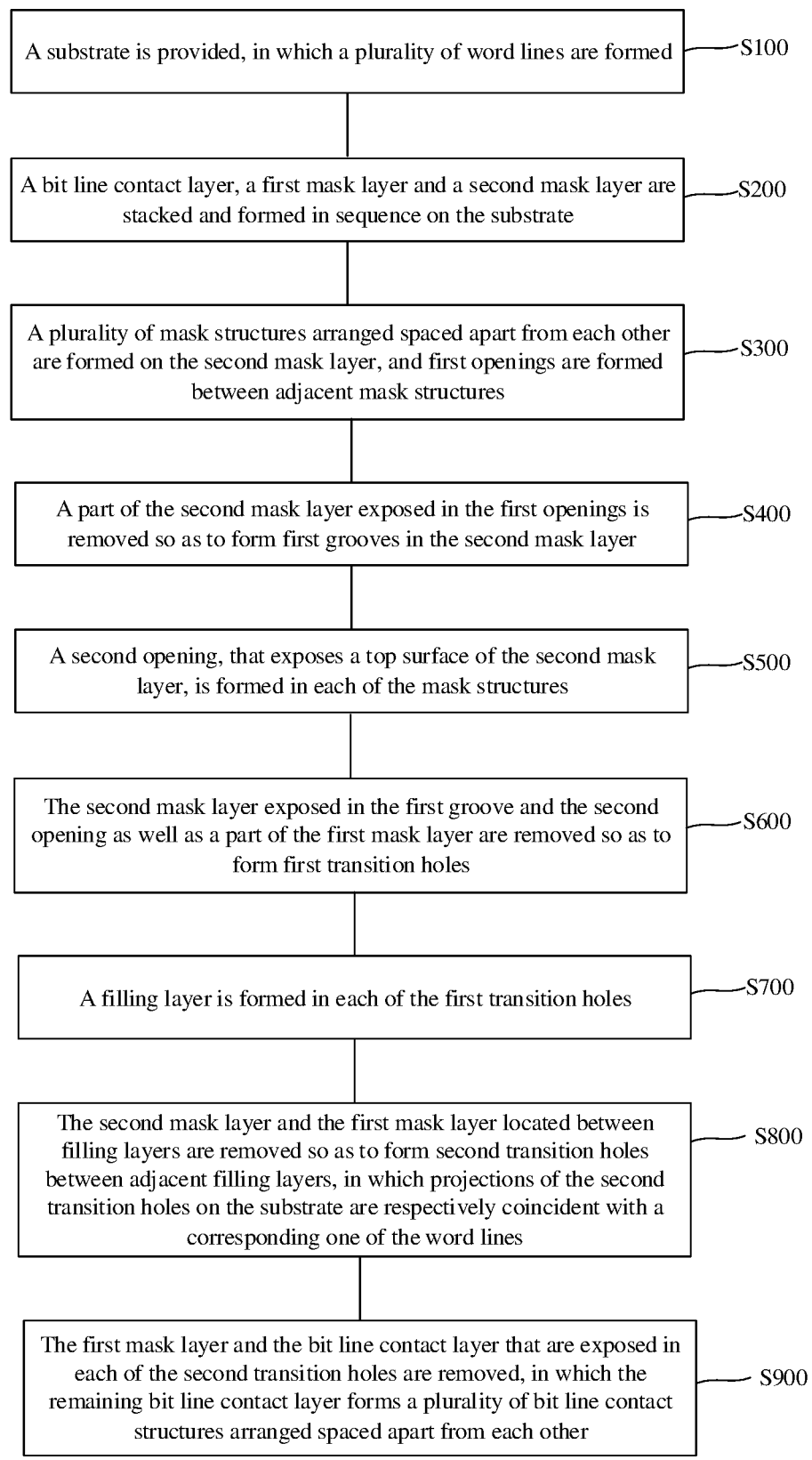
FIG. 5 illustrates a first process flowchart of a method for manufacturing a semiconductor structure provided in the first embodiment of this disclosure.
Figure 14:
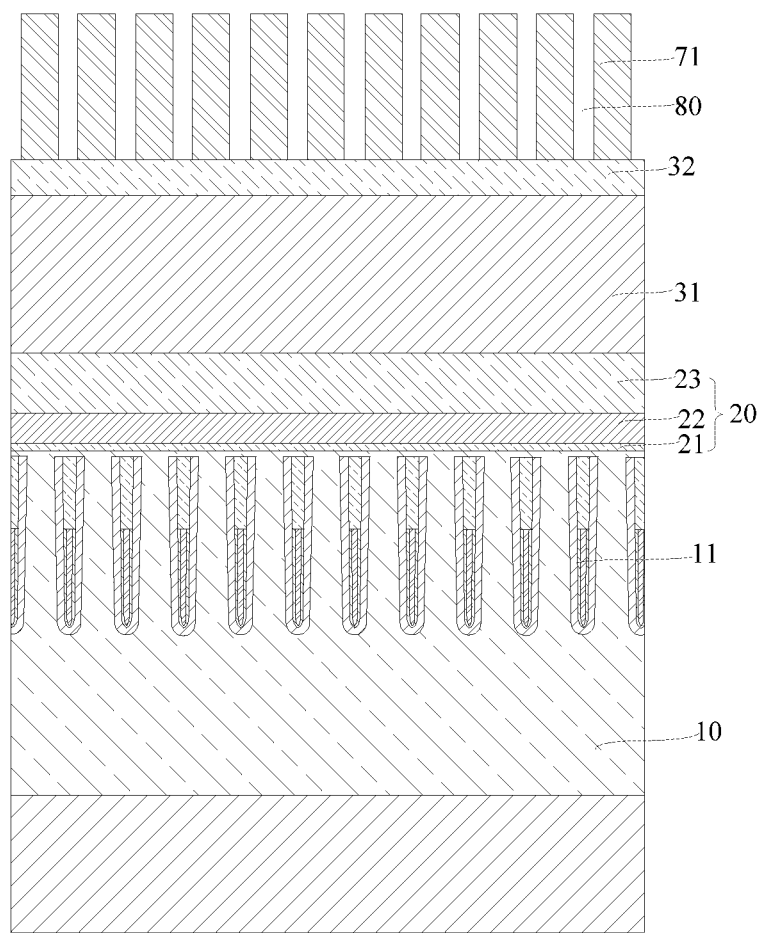
FIG. 14 illustrates a schematic structural diagram of forming a second transition hole in the method for manufacturing a semiconductor structure provided in Embodiment 1 of this disclosure.
Figure 15:
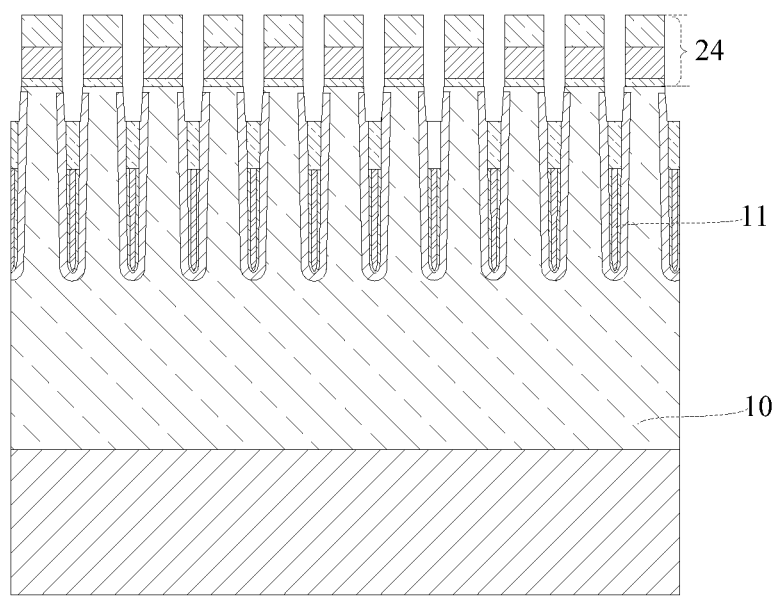
FIG. 15 illustrates a schematic diagram of forming a bit line contact structure in the method for manufacturing a semiconductor structure provided in the first embodiment of this disclosure.
Figure 16:
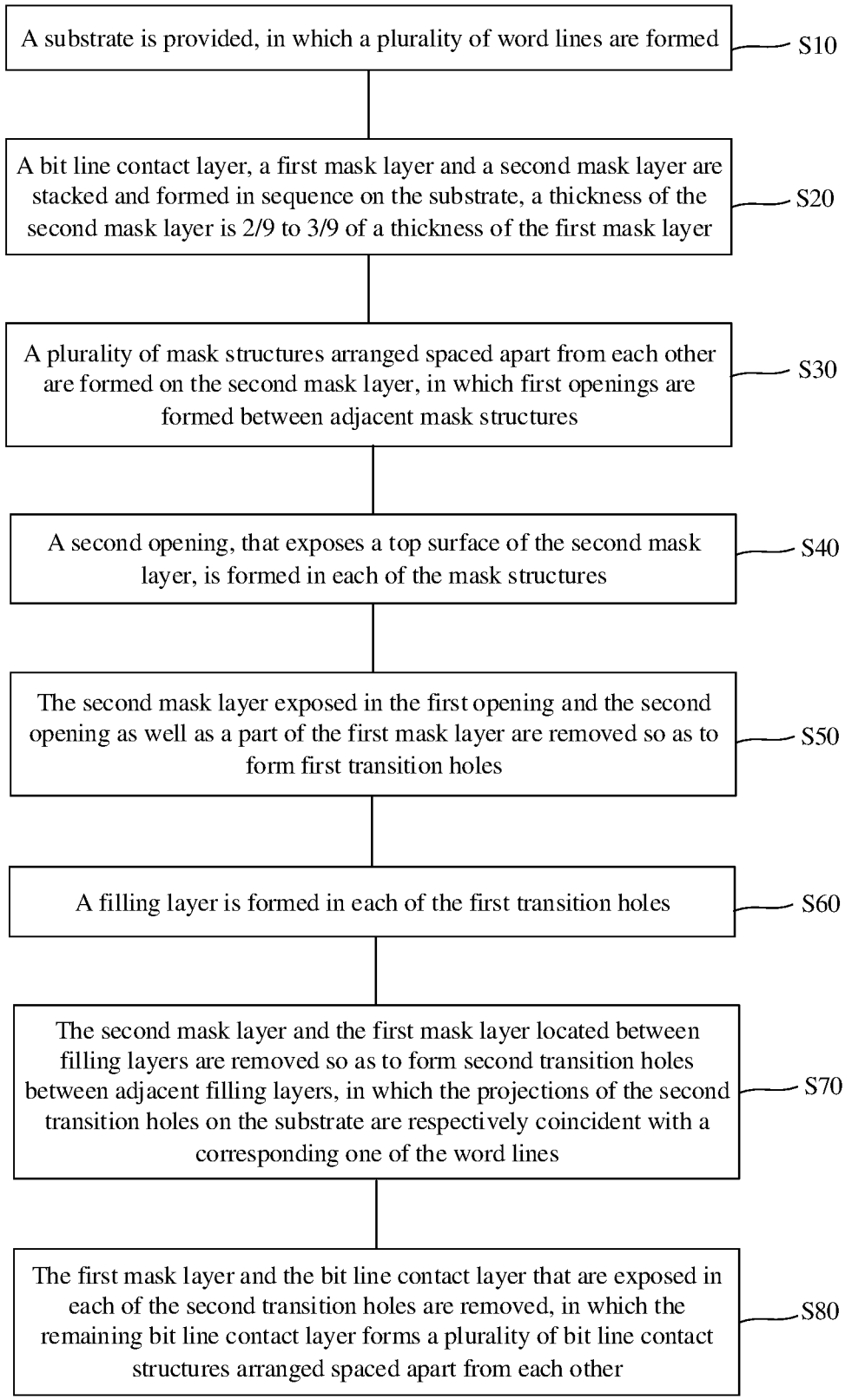
FIG. 16 illustrates a process flow diagram of a method for manufacturing a semiconductor structure provided in the second embodiment of this disclosure.

FIG. 5 illustrates a process flowchart of the method for manufacturing a semiconductor structure provided in the first embodiment of this disclosure, FIG. 16 illustrates a process flowchart of the method for manufacturing a semiconductor structure provided in the second embodiment of this disclosure, FIGS. 6 to 15, 17 and 18 are schematic diagrams of various stages of the methods for manufacturing a semiconductor structure, and the methods for manufacturing a semiconductor structure will be described in detail below in combination with FIGS. 5-18.

The embodiments do not limit a semiconductor structure. The following will introduce a semiconductor structure with a dynamic random access memory (DRAM) as an example, but the embodiment is not limited to this, and the semiconductor structure in this embodiment may also be other structures.

The First Embodiment

As shown in FIG. 5, the method for manufacturing a semiconductor structure provided in the embodiment of this disclosure includes the following operations.

In S100: a substrate in which a plurality of word lines are formed is provided.

Figure 6:
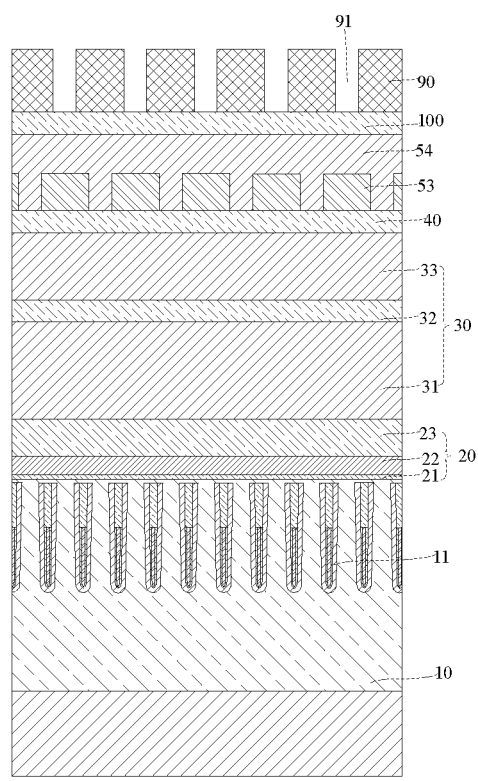
FIG. 6 illustrates a schematic structural diagram of forming a bit line contact layer, a first mask layer, and a second mask layer in the method for manufacturing a semiconductor structure provided in the first embodiment of this disclosure.

Exemplarily, as shown in FIG. 6, the substrate 10 is used as a supporting component of the semiconductor structure to support other components provided thereon. The substrate 10 may be made of a semiconductor material which may be one or more of silicon, germanium, a silicon germanium compound and a silicon carbon compound.

A plurality of word lines 11 are formed in the substrate 10, and the plurality of word lines 11 are arranged as an array in the substrate 10. Each of the word lines 11 is used to connect to the gate of a transistor provided in the substrate 10 to control the opening or closing of the transistor by the word line 11.

In S200, a bit line contact layer, a first mask layer and a second mask layer are stacked and formed in sequence on the substrate.

Exemplarily, further referring to FIG. 6, the bit line contact layer 20, the first mask layer 30, and the second mask layer 40 may be sequentially formed on the substrate 10 by an atomic layer deposition process, a chemical vapor deposition process or a physical vapor deposition process. The bit line contact layer 20 is used to form bit line contact structures, and the bit lines are connected to the drains in the substrate by the bit line contact structures so as to complete the functions of reading data from and storing data to a memory. The bit line contact layer 20 may be a stacked structure, for example, the bit line contact layer 20 may include a barrier layer 21, a conductive layer 22 and an insulating layer 23.

Firstly, the barrier layer 21, the conductive layer 22, and the insulating layer 23 may be sequentially formed on the substrate 10 by a deposition process. For example, the conductive layer 22 may be formed on the surface of the barrier layer 21 away from the substrate 10, and the insulating layer 23 may be formed on the surface of the conductive layer 22 away from the barrier layer 21. The conductive layer 22 may include a conductive material such as polysilicon. The electrical connection between a bit line contact structure and a drain in the substrate is realized by the conductive layer. The barrier layer 21 may include an insulating material such as silicon nitride, and the insulating layer 23 may include an insulating material such as silicon oxide to achieve the insulation between the conductive layer and other components provided on the insulating layer.

Then, the first mask layer 30 may be formed on the insulating layer 23 by an atomic layer deposition process, a physical vapor deposition process or a chemical vapor deposition process. The first mask layer 30 may be a single-layer structure or a stacked-layer structure.

For example, when the first mask layer 30 is a stacked-layer structure, the first mask layer 30 may include a first hard mask layer 31, a first silicon oxynitride layer 32, and a second hard mask layer 33. The first hard mask layer 31 may be formed on the bit line contact layer 20 by a deposition process, that is, formed on the insulating layer 23 by a deposition process.

The first silicon oxynitride layer 32 may be formed on the surface of the first hard mask layer 31 away from the substrate by a deposition process, and the second hard mask layer 33 may be formed on the surface of the first silicon oxynitride layer 32 away from the first hard mask layer 31 by a deposition process.

After that, the second mask layer 40 is formed on the second hard mask layer 33 by a deposition process, the thickness of which is 4/9 to 5/9 of the thickness of the first mask layer 30. For example, if the thickness of the first mask layer 30 is 90 nm, the thickness of the second mask layer 40 is between 40 nm and 50 nm correspondingly.

In S300, a plurality of mask structures arranged spaced apart from each other are formed on the second mask layer, and first openings are formed between adjacent mask structures. Each of the mask structures may be composed of a single species of material or a plurality of species of materials.

Exemplarily, further referring to FIG. 6, a plurality of mask blocks 53 arranged spaced apart from each other may be formed on the second mask layer 40 by a deposition process. The mask blocks 53 may include an insulating material, such as silicon oxide.

Subsequently, a third hard mask layer 54 is formed on the second mask layer 40 located between the adjacent mask blocks 53, and the third hard mask layer 54 covers the mask blocks 53, that is, the third hard mask layer 54 may be deposited between the adjacent mask blocks 53 by a deposition process, and the third hard mask layer covers the mask blocks 53.

After the third hard mask layer 54 is formed, a photoresist layer 90 with a certain thickness may be formed on the third hard mask layer 54 by coating, and then the photoresist layer 90 may be patterned by exposure, development or etching so as to form a plurality of third openings 91 arranged at intervals in the photoresist layer 90. The projection of each of the third openings 91 on the third hard mask layer 54 is located within each of the mask blocks 53.

Figure 7:
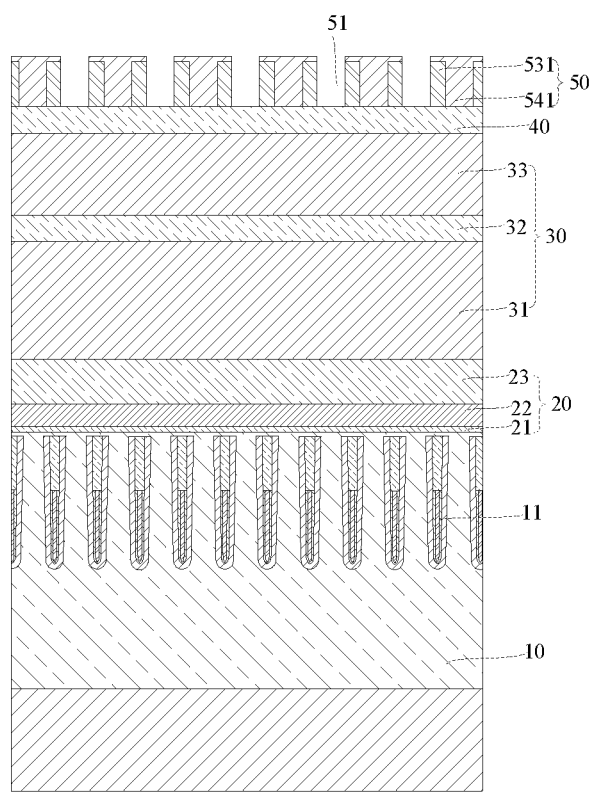
FIG. 7 illustrates a schematic diagram of forming a mask structure in the method for manufacturing a semiconductor structure provided in the first embodiment of this disclosure.

After that, as shown in FIG. 7, by using an etching solution or an etching gas, the third hard mask layer 54 and the mask block 53 that are exposed in the third openings 91 are removed, thus a plurality of T-shaped mask blocks 541 arranged at intervals are formed by the remaining third hard mask layer 54, and each of the remaining mask blocks 53 forms two mask strips 531. The two mask strips 531 are respectively located on both sides of the vertical section of each T-shaped mask block 541, and each T-shaped mask block 541 and two mask strips 531 connected thereto constitute one mask structure 50.

After forming the third hard mask layer on the second mask layer located between the adjacent mask blocks and before forming the photoresist layer on the third hard mask, the method for manufacturing a semiconductor structure may further include: forming a second silicon oxynitride layer 100 on the third hard mask layer 54 so as to ensure the accuracy of the pattern to be transferred.

In S400, a part of the second mask layer exposed in first openings is removed so as to form first grooves in the second mask layer.

Figure 8:
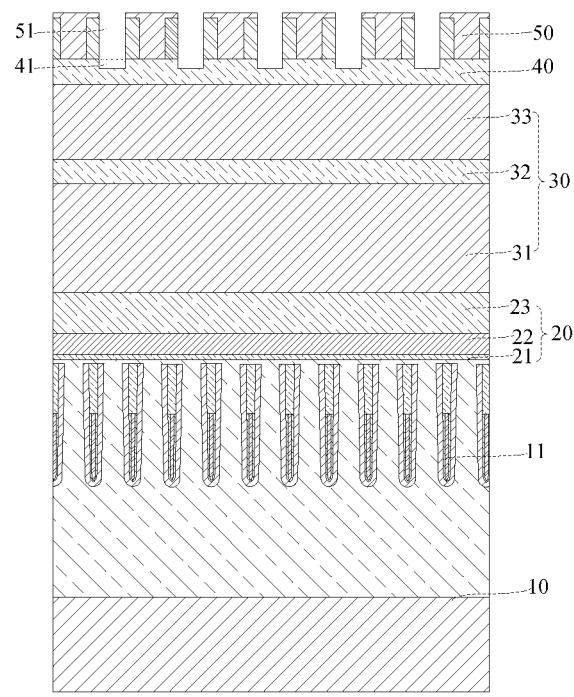
FIG. 8 illustrates a schematic structural diagram of forming a first groove in the method for manufacturing a semiconductor structure provided in the first embodiment of this disclosure.

As shown in FIG. 8, the mask structures 50 are used as a mask plate, and a part of the second mask layer 40 exposed in the first openings 51 is etched by introducing an etching gas or an etching solution into the first opening 51 so as to form the first groove 41 in the second mask layer 40. The ratio of the depth of the first groove 41 to the thickness of the second mask layer 40 is between 1:3 and 1:2, namely, the depth of the first groove 41 is less than half of the thickness of the second mask layer 40.

If the ratio of the depth of the first groove 41 to the thickness of the second mask layer 40 is less than 1:3, that is, the depth of the first groove 41 is too small to achieve the function of reducing the thickness of the second mask layer, so that there is still a risk of laterally etching to the second mask layer when etching the second mask layer subsequently. If the ratio of the depth of the first groove 41 to the thickness of the second mask layer 40 is greater than 1:2, that is, the depth of the first groove 41 is too large, thus the cost of etching the second mask layer will increase. Therefore, in this embodiment, the ratio of the depth of the first groove to the thickness of the second mask layer is limited, which not only prevents lateral etching to the second mask layer, but also reduces the etching cost.

It should be noted that the first opening 51 is a region located above the dotted line, and the first groove 41 is a region located between the dotted line and the second mask layer 40.

In S500, second openings that expose the top surface of the second mask layer is formed in each of the mask structures.

Figure 9:
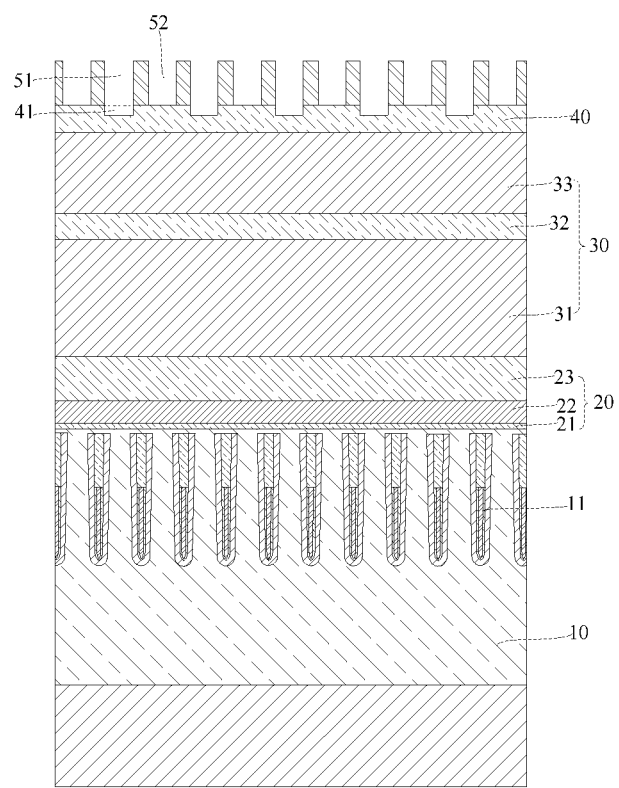
FIG. 9 illustrates a schematic structural diagram of forming a second opening in the method for manufacturing a semiconductor structure provided in the first embodiment of this disclosure.

Exemplarily, as shown in FIG. 9, the T-shaped mask blocks 541 are removed, each pair of two mask strips 531 located on both sides of the vertical section of each T-shaped mask block 541 are remained, and the second openings 52 are formed between the pairs of mask strips 531.

Taking one of the mask structures 50 as an example, the T-shaped mask block 541 in the mask structure 50 may be removed by cleaning, and the two oppositely disposed mask strips 531 in the mask structure 50 may be retained, and a second opening 52 is formed between the two mask strips 531.

In S600, the second mask layer exposed in the first grooves and the second openings as well as a part of the first mask layer are removed so as to form first transition holes.

Figure 10:
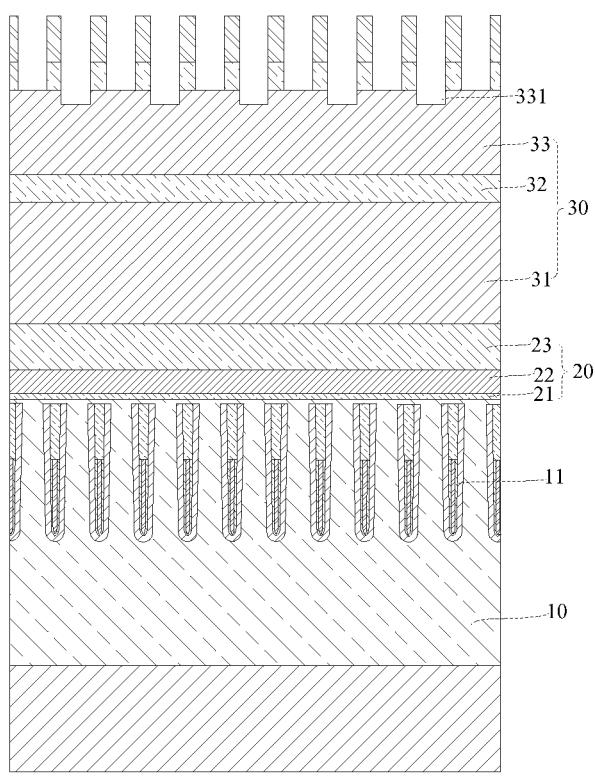
FIG. 10 illustrates a first schematic structural diagram of forming a first transition hole in the method for manufacturing a semiconductor structure provided in the first embodiment of this disclosure.
Figure 11:
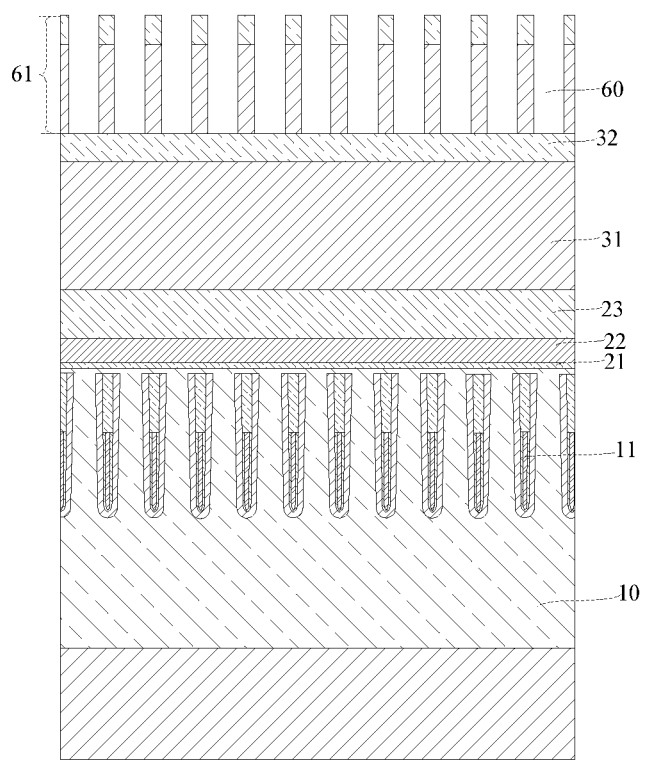
FIG. 11 illustrates a second schematic structural diagram of forming a first transition hole in the method for manufacturing a semiconductor structure provided in the first embodiment of this disclosure.

As shown in FIGS. 9 to 11, the second mask layer 40 exposed in the first groove 41 and the second opening 52 as well as a part of the first mask layer 30 are removed by an etching liquid or an etching gas, so as to form the first transition holes in the second mask layer 40 and the first mask layer 30.

It should be noted that in this embodiment, the first transition hole 60 may be directly formed by a one-step etching process, or the first transition hole 60 may be formed by a two-step etching process. For example, as shown in FIGS. 9 and 10, firstly, the second mask layer 40 exposed in the first grooves 41 and a part of the second hard mask layer 33 are removed by an etching liquid or an etching gas, so as to form the second grooves 331 in the second hard mask layer 33, and the second mask layer 40 exposed in the second opening 52 is removed to expose the top surface of the second hard mask layer 33, so that the top surface of the second hard mask layer 33 may be uneven.

Subsequently, as shown in FIG. 11, the second hard mask layer 33 is further etched along the second opening 52 and the second groove 331 to form the first transition holes 60. That is, the second hard mask layer 33 exposed in the second opening 52 and the second groove 331 may be etched respectively to form the first transition holes 60 in the second hard mask layer 33. The first transition holes 60 expose the top surface of the first silicon oxynitride layer 32, and mask protrusions 61 are formed between adjacent first transition holes 60.

In this embodiment, the second mask layer and a part of the first mask layer are removed by two-step etching. In this way, the pattern may be transferred to the second mask layer first, and then the second mask layer may be used as a mask plate to etch the first mask layer, so as to improve the accuracy of the first transition holes, ensure the accuracy of the subsequent bit line contact structures, thereby improving the performance of the semiconductor structure.

In S700, a filling layer is formed in each of the first transition holes.

Figure 12:
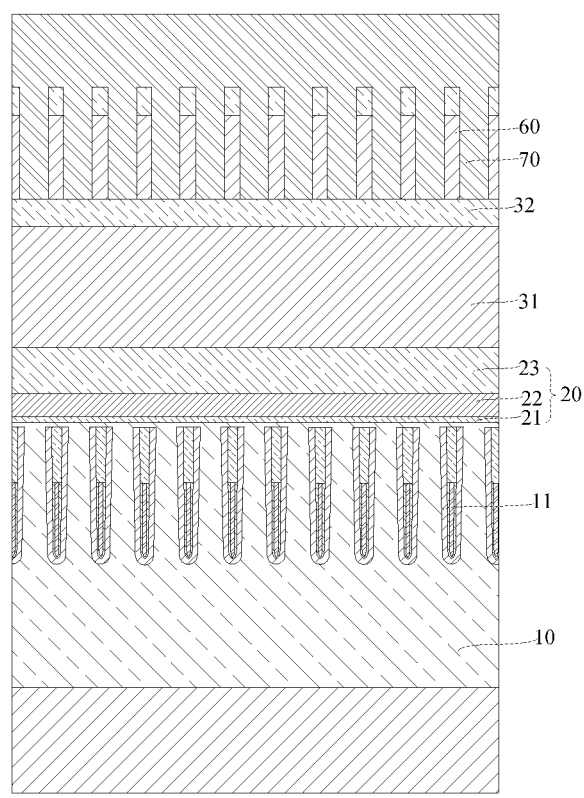
FIG. 12 illustrates a schematic structural diagram of forming an initial filling layer in the method for manufacturing a semiconductor structure provided in the first embodiment of this disclosure.

Exemplarily, as shown in FIG. 12, an initial filling layer 70 may be formed in each of the first transition holes 60 by a physical vapor deposition process or a chemical vapor deposition process, and the initial filling layer 70 extends outside the first transition holes 60 and covers the mask protrusion 61.

Figure 13:
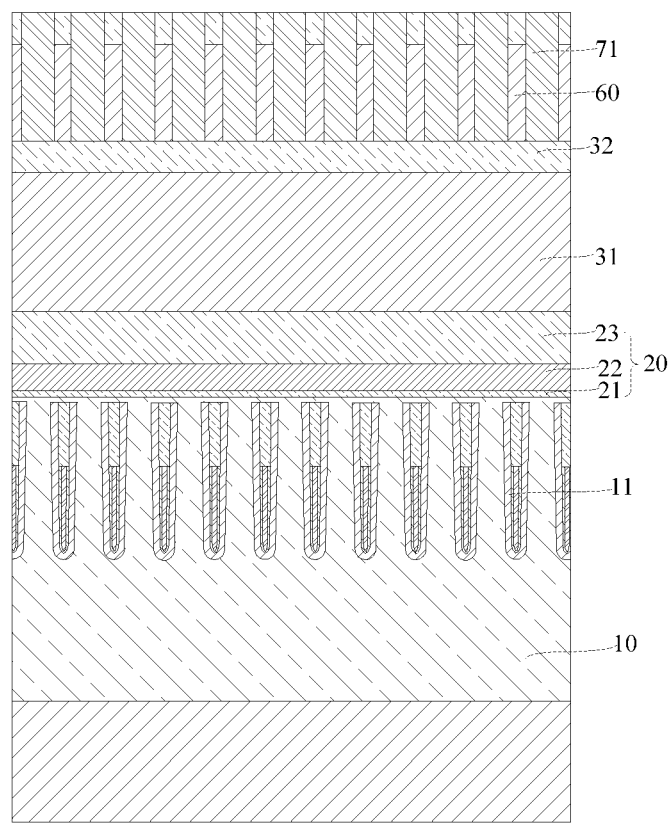
FIG. 13 illustrates a schematic structural diagram of forming a filling layer in the method for manufacturing a semiconductor structure provided in the first embodiment of this disclosure.

Then, as shown in FIG. 13, by using an etching solution or an etching gas, a part of the initial filling layer 70 is removed so that the top surface of the initial filling layer 70 is flush with the top surfaces of the mask protrusions 61, and the remaining initial filling layer 70 constitutes filling layers 71.

In S800, the second mask layer and the first mask layer located between the filling layers are removed so as to form second transition holes between adjacent filling layers. The projections of the second transition holes on the substrate are respectively coincident with the corresponding one of the word lines.

Exemplarily, as shown in FIG. 14, the second mask layer 40 and the first hard mask layer 31 are removed and the filling layer 71 is retained, so that second transition holes 80 are formed between the adjacent filling layers 71.

In S900, the first mask layer and the bit line contact layer exposed by each of the second transition holes are removed, and a plurality of bit line contact structures arranged spaced apart from each other are formed by the remaining bit line contact layer.

Exemplarily, as shown in FIG. 15, the first silicon oxynitride layer 32, the first hard mask layer 31, and the bit line contact layer 20 that are exposed by the second transition hole 80 may be removed first, and then the remaining first silicon oxynitride layer 32 and the first hard mask layer 31 are moved, and finally, the remaining bit line contact layer 20 forms a plurality of bit line contact structures 24 arranged spaced apart from each other, each of which is located between adjacent word lines 11.

In this embodiment, by etching the second mask layer with the mask structures as the mask plate, the local thickness of the second mask layer is reduced, and the overall thickness of the second mask layer is reduced. In this way, in the subsequent process of etching the second mask layer, the etching time of the second mask layer may be shortened because of the reduction of the thickness of the second mask layer, and furthermore, the risk of lateral etching to the second mask layer is reduced so as to ensure the accuracy of formed etching holes in the second mask layer, thereby avoiding the loss of bit line contact structures, and improving the performance of semiconductor structure.

The Second Embodiment

The embodiments of this disclosure further provide a method for manufacturing a semiconductor structure, which includes the following operations.

In S10, a substrate in which a plurality of word lines are formed is provided.

Since the process of forming the substrate, the first mask layer and the second mask layer in this embodiment is the same as in the first embodiment, FIG. 6 in the first embodiment may be used as a reference drawing. Exemplarily, as shown in FIG. 6, the substrate 10 is used as a supporting component of the semiconductor structure to support other components provided thereon. The substrate 10 may be made of a semiconductor material, which may be one or more of silicon, germanium, a silicon germanium compound and a silicon carbon compound.

A plurality of word lines 11 are formed in the substrate 10, and the plurality of word lines 11 are arranged as an array in the substrate 10. Each of the word lines 11 is used to connect to the gate of a transistor provided in the substrate 10 to control the opening or closing of the transistor by the word line 11.

In S20, a bit line contact layer, a first mask layer and a second mask layer are stacked and formed in sequence on the substrate, and the thickness of the second mask layer is 2/9 to 3/9 of the thickness of the first mask layer.

If the thickness of the first mask layer 30 is 90 nm, the thickness of the second mask layer 40 is between 20 nm and 30 nm. Compared with the related art in which the thickness of the second mask layer 40 is between 40 nm and 50 nm, the thickness of the second mask layer 40 is directly reduced in this embodiment. In this way, when the second mask layer 40 is subsequently etched, the lateral etching to the second mask layer 40 may be prevented, so as to prevent the loss of the subsequently formed bit line contact structures, thereby improving the performance of the semiconductor structure.

It should be noted that both this embodiment and the first embodiment are improvements to solve the technical problem that the second mask layer is easy to be laterally etched in the related art, resulting in the loss of the subsequently formed bit line contact structures. In the first embodiment, the second mask layer 40 is partially thinned to prevent lateral etching to the second mask layer, whereas in this embodiment, the second mask layer 40 is overall thinned to prevent lateral etching to the second mask layer.

In this embodiment, as shown in FIG. 6, the bit line contact layer 20, the first mask layer 30, and the second mask layer 40 may be sequentially formed on the substrate 10 by an atomic layer deposition process, a chemical vapor deposition process or a physical vapor deposition process. The bit line contact layer 20 is used to form bit line contact structures, and the bit lines are connected to the drains in the substrate by the bit line contact structures so as to complete the functions of reading data from and storing data to the memory. The bit line contact layer 20 may be a stacked structure, for example, the bit line contact layer 20 may include a barrier layer 21, a conductive layer 22 and an insulating layer 23.

Firstly, the barrier layer 21, the conductive layer 22, and the insulating layer 23 may be sequentially formed on the substrate 10 by a deposition process. For example, the conductive layer 22 may be formed on the surface of the barrier layer 21 away from the substrate 10, and the insulating layer 23 may be formed on the surface of the conductive layer 22 away from the barrier layer 21. The conductive layer 22 may include a conductive material such as polysilicon. The electrical connection between a bit line contact structure and a drain in the substrate is realized by the conductive layer. The barrier layer 21 may include an insulating material such as silicon nitride, and the insulating layer 23 may include an insulating material such as silicon oxide to achieve the insulation between the conductive layer and other components provided on the insulating layer.

Then, the first mask layer 30 may be formed on the insulating layer 23 by an atomic layer deposition process, a physical vapor deposition process, or a chemical vapor deposition process. The first mask layer 30 may be a single-layer structure or a stacked-layer structure.

Exemplarily, when the first mask layer 30 is a stacked-layer structure, the first mask layer 30 may include a first hard mask layer 31, a first silicon oxynitride layer 32, and a second hard mask layer 33. The first hard mask layer 31 may be formed on the bit line contact layer 20 by a deposition process, that is, formed on the insulating layer 23 by a deposition process.

The first silicon oxynitride layer 32 may be formed on the surface of the first hard mask layer 31 away from the substrate by a deposition process, and the second hard mask layer 33 may be formed on the surface of the first silicon oxynitride layer 32 away from the first hard mask layer 31 by a deposition process.

After that, the second mask layer 40 is formed on the second hard mask layer 33 by a deposition process, and the thickness of the second mask layer is ⅖ to ⅗ of the thickness of the first mask layer.

In S30, a plurality of mask structures arranged spaced apart from each other are formed on the second mask layer, and first openings are formed between adjacent mask structures.

It should be noted that the process of forming the mask structure in this embodiment is the same as that in the first embodiment, and FIG. 7 in the first embodiment may be used as a reference drawing. Specifically: as shown in FIG. 7, a plurality of mask structures 50 may be formed on the second mask layer 40, and the mask structures 50 may be mask blocks composed of a single species of material, or have other structures.

Exemplarily, further referring to FIG. 6, a plurality of mask blocks 53 arranged spaced apart from each other may be formed on the second mask layer 40 by a deposition process. The mask blocks 53 may include an insulating material such as silicon oxide.

Subsequently, a third hard mask layer 54 is formed on the second mask layer 40 located between the adjacent mask blocks 53. The third hard mask layer 54 covers the mask blocks 53, that is, the third hard mask layer 54 may be deposited between the adjacent mask blocks 53 by a deposition process, and the third hard mask layer covers the mask blocks 53.

After the third hard mask layer 54 is formed, a photoresist layer 90 with a certain thickness may be formed on the third hard mask layer 54 by coating, and then the photoresist layer 90 may be patterned by exposure, development or etching so as to form a plurality of third openings 91 arranged at intervals in the photoresist layer 90. The projection of each of the third openings 91 on the third hard mask layer 54 is located within each of the mask blocks 53.

After that, as shown in FIG. 7, by using an etching solution or an etching gas, the third hard mask layer 54 and the mask block 53 that are exposed in the third opening 91 are removed, thus a plurality of T-shaped mask blocks 541 arranged at intervals are formed by the remaining third hard mask layer 54, and each of the remaining mask blocks 53 forms two mask strips 531. The two mask strips 531 are respectively located on both sides of the vertical section of each T-shaped mask block 541, and each T-shaped mask block 541 and two mask strips 531 connected to the T-shaped mask block constitute one mask structure 50.

In S40, a second opening that exposes the top surface of the second mask layer is formed in each of the mask structures.

Figure 17:
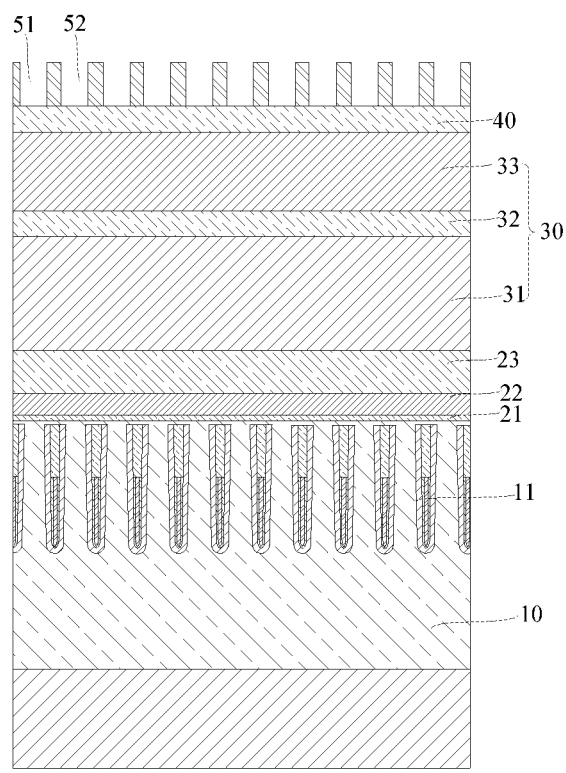
FIG. 17 illustrates a schematic structural diagram of forming a second opening in the method for manufacturing the semiconductor structure provided in the second embodiment of this disclosure.

Exemplarily, as shown in FIG. 17, the T-shaped mask blocks 541 are removed, each pair of two mask strips 531 located on both sides of the vertical section of each T-shaped mask block 541 are remained, and the second openings 52 are formed between pairs of the mask strips 531.

Taking one of the mask structures 50 as an example, the T-shaped mask block 541 in the mask structure 50 may be removed by cleaning, and the two oppositely disposed mask strips 531 in the mask structure 50 may be retained, and a second opening 52 is formed between the two mask strips 531.

In S50, the second mask layer exposed in the first openings and the second openings as well as a part of the first mask layer are removed so as to form first transition holes.

The second mask layer 40 exposed in the first openings 51 and the second openings 52 as well as a part of the first mask layer 30 are removed by an etching liquid or an etching gas, so as to form the first transition holes in the second mask layer 40 and the first mask layer 30.

Figure 18:
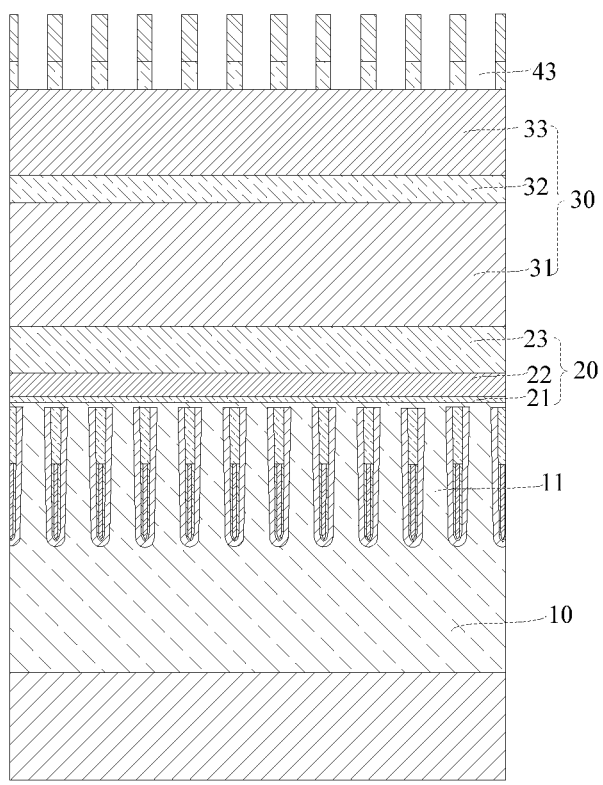
FIG. 18 illustrates a schematic structural diagram of forming a first transition hole in the method for manufacturing the semiconductor structure provided in the second embodiment of this disclosure.

It should be noted that in this embodiment, the first transition holes 60 may be directly formed by a one-step etching process, or the first transition holes 60 may be formed by a two-step etching process. For example, as shown in FIG. 18, firstly, the second mask layer 40 exposed in the first openings 51 and the second openings 52 is removed by an etching solution or an etching gas, so as to form a fourth opening 43 in the second mask layer 40.

Subsequently, the second hard mask layer 33 exposed in the fourth openings 43 is removed to form the first transition holes 60, that is, the second hard mask layer 33 exposed in the second openings 52 and the first openings 51 may be etched respectively so as to form first transition holes 60 in the second hard mask layer 33. The first transition holes 60 expose the top surface of the first silicon oxynitride layer 32, and mask protrusions 61 are formed between adjacent first transition holes 60, and the formed structure is as shown in FIG. 11.

It should be noted that the process of removing the second hard mask layer 33 in this embodiment is the same as the process of removing the second hard mask layer 33 in the first embodiment, so FIG. 11 can be referred to.

In this embodiment, the second mask layer and a part of the first mask layer are removed by two-step etching. In this way, the pattern may be transferred to the second mask layer first, and then the second mask layer may be used as a mask plate to etch the first mask layer, so as to improve the accuracy of the first transition holes, and furthermore ensure the accuracy of the subsequent bit line contact structures, thereby improving the performance of the semiconductor structure.

The following operations are the same as those in the first embodiment. Therefore, the following operations may be described in detail with reference to FIGS. 12 to 15.

In S60, a filling layer is formed in each of the first transition holes.

Exemplarily, as shown in FIG. 12, an initial filling layer 70 may be formed in each of the first transition holes 60 by a physical vapor deposition process or a chemical vapor deposition process, and the initial filling layer 70 extends outside the first transition holes 60 and covers the mask protrusion 61.

Then, as shown in FIG. 13, by using an etching solution or an etching gas, the part of the initial filling layer 70 is removed so that the top surface of the initial filling layer 70 is flush with the top surfaces of the mask protrusions 61, and the remaining initial filling layer 70 constitutes filling layers 71.

In S70, the second mask layer and the first mask layer located between the filling layers are removed so as to form second transition holes between adjacent filling layers. The projections of the second transition holes on the substrate are respectively coincident with one of the word lines.

Exemplarily, as shown in FIG. 14, the second mask layer 40 and the first hard mask layer 31 are removed and the filling layer 71 is retained, so that second transition holes 80 are formed between the adjacent filling layers 71.

In S80, the first mask layer and the bit line contact layer exposed in each of the second transition holes are removed, and a plurality of bit line contact structures arranged spaced apart from each other are formed by the remaining bit line contact layer.

Exemplarily, as shown in FIG. 15, the first silicon oxynitride layer 32, the first hard mask layer 31, and the bit line contact layer 20 that are exposed by the second transition hole 80 may be removed first, and then the remaining first silicon oxynitride layer 32 and the first hard mask layer 31 are moved, and finally, the remaining bit line contact layer 20 forms a plurality of bit line contact structures 24 arranged spaced apart from each other, each of which is located between adjacent word lines 11.

In this embodiment, with the thickness of the second mask layer being ⅖ to ⅗ of the thickness of the first mask layer, the overall thickness of the second mask layer is reduced. In the subsequent process of etching the second mask layer, the etching time of the second mask layer may be shortened because of the reduction of the thickness of the second mask layer, and furthermore, the risk of lateral etching to the second mask layer is reduced so as to ensure the accuracy of formed etching holes in the second mask layer, thereby avoiding the loss of bit line contact structure, and improving the performance of semiconductor structure.

The Third Embodiment

Embodiments of this disclosure further provide a semiconductor structure that is made by the method for manufacturing a semiconductor structure in the first embodiment; or made by the method for manufacturing a semiconductor structure in the second embodiment.

The semiconductor structure provided in this embodiment is manufactured by the method described in the above embodiments, and therefore, the bit line contact structure in the semiconductor structure may be prevented from being lost, and the performance of the semiconductor structure may be improved.

The embodiments or implementation modes in this specification are described in a progressive manner, each of the embodiments focuses on the differences from other embodiments, and the same or similar parts between the various embodiments can be referred to each other.

In the description of this specification, the description referring to the terms "an embodiment", "some embodiments", "schematic embodiment", "example", "specific example", or "some examples" means that the specific features, structures, materials or characteristics described in combination with the embodiments or examples are included in at least one embodiment or example of this disclosure.

In this specification, the schematic representation of the above terms does not necessarily refer to the same implementation or example. Moreover, the described specific features, structures, materials or characteristics may be combined in an appropriate manner in any one or more implementations or examples.

Finally, it should be noted that the above embodiments are not used to limit the technical solutions of this disclosure, but only used to illustrate them. Although this disclosure has been described in detail with reference to the above embodiments, those skilled in the art should understand that: the technical solutions described in the above embodiments may still be modified, or some or all of the technical features may be equivalently replaced, and these modifications or replacements do not make the essence of the corresponding technical solutions apart from the scope of the technical solutions in the embodiments of this disclosure.

The invention claimed is:

1. A method for manufacturing a semiconductor structure, comprising:
    providing a substrate, in which a plurality of word lines are formed;
    stacking and forming a bit line contact layer, a first mask layer and a second mask layer in sequence on the substrate;
    forming a plurality of mask structures arranged spaced apart from each other on the second mask layer, and forming first openings between adjacent mask structures;
    removing a part of the second mask layer exposed in the first openings so as to form first grooves in the second mask layer;
    forming a second opening that exposes a top surface of the second mask layer in each of the mask structures;
    removing the second mask layer exposed in the first grooves and the second openings as well as a part of the first mask layer so as to form first transition holes;
    forming a filling layer in each of the first transition holes;
    removing the second mask layer and the first mask layer located between filling layers so as to form second transition holes between adjacent filling layers, wherein projections of the second transition holes on the substrate are respectively coincident with a corresponding one of the word lines; and
    removing the first mask layer and the bit line contact layer that are exposed in each of the second transition holes, wherein a plurality of bit line contact structures arranged spaced apart from each other are formed from the remaining bit line contact layer.

2. The method for manufacturing a semiconductor structure according to claim 1, wherein a thickness of the second mask layer is 4/9 to 5/9 of a thickness of the first mask layer.

3. The method for manufacturing a semiconductor structure according to claim 1, wherein a ratio of a depth of the first grooves to a thickness of the second mask layer is between 1:3 and 1:2.

4. The method for manufacturing a semiconductor structure according to claim 3, wherein the first mask layer comprises a first hard mask layer, a first silicon oxynitride layer and a second hard mask layer stacked in sequence, and the first hard mask layer is disposed on the bit line contact layer.

5. The method for manufacturing a semiconductor structure according to claim 4, wherein forming the plurality of mask structures arranged spaced apart from each other on the second mask layer comprises:
   forming a plurality of mask blocks arranged spaced apart from each other on the second mask layer;
   forming a third hard mask layer on the second mask layer located between adjacent mask blocks, wherein the third hard mask layer covers the mask blocks;
   forming a photoresist layer on the third hard mask layer, wherein the photoresist layer has a plurality of third openings arranged at intervals, and a projection of each of the third openings on the third hard mask layer is located within each of the mask blocks; and
   removing the third hard mask layer and the mask blocks that are exposed in the third openings, wherein a plurality of T-shaped mask blocks arranged at intervals are formed from the remaining third hard mask layer, two mask strips are formed from each of the remaining mask blocks which are respectively located on both sides of a vertical section of each of the T-shaped mask blocks, and each of the T-shaped mask blocks and the mask strips connected to the T-shaped mask block constitute one of the mask structures.

6. The method for manufacturing a semiconductor structure according to claim 5, wherein a material of the mask blocks comprises silicon oxide.

7. The method for manufacturing a semiconductor structure according to claim 6, wherein forming the second opening on each of the mask structures comprises:
   removing the T-shaped mask block, and remaining the two mask strips located on both sides of the vertical section of the T-shaped mask block, wherein the second opening is formed between mask strips.

8. The method for manufacturing a semiconductor structure according to claim 7, wherein removing the second mask layer exposed in the first grooves and the second openings as well as a part of the first mask layer so as to form the first transition holes comprises:
   removing the second mask layer and a part of the second hard mask layer exposed in the first grooves, and removing the second mask layer exposed in the second openings so that a top surface of the second hard mask layer is uneven; and
   continuing to etch the second hard mask layer along the second openings and the first grooves so as to form the first transition holes, wherein the first transition holes exposes the top surface of the first silicon oxynitride layer, and mask protrusions are formed between adjacent first transition holes.

9. The method for manufacturing a semiconductor structure according to claim 8, wherein forming the filling layers in each of the first transition holes comprises:
   forming an initial filling layer in each of the first transition holes, wherein the initial filling layer covers the mask protrusions; and
   back etching the initial filling layer and remaining the initial filling layer located in the first transition holes, wherein the remaining initial filling layer constitutes filling layers.

10. The method for manufacturing a semiconductor structure according to claim 9, wherein top surfaces of the filling layers are flush with the top surfaces of the mask protrusions, and a material of the filling layers comprises silicon oxide.

11. The method for manufacturing a semiconductor structure according to claim 10, further comprises: forming a second silicon oxynitride layer on the third hard mask layer after forming the third hard mask layer on the second mask layer located between the adjacent mask blocks, and before forming the photoresist layer on the third hard mask, the manufacturing method.

12. The method for manufacturing a semiconductor structure according to claim 1, wherein the bit line contact layer comprises a barrier layer, a conductive layer, and an insulating layer stacked in sequence, and the barrier layer is arranged on the substrate.

13. A method for manufacturing a semiconductor structure, comprising:
   providing a substrate, in which a plurality of word lines are formed;
   stacking and forming a bit line contact layer, a first mask layer and a second mask layer in sequence on the substrate, wherein a thickness of the second mask layer is 2/9 to 3/9 of a thickness of the first mask layer;
   forming a plurality of mask structures arranged spaced apart from each other on the second mask layer, and forming first openings between adjacent mask structures;
   forming a second opening that exposes a top surface of the second mask layer in each of the mask structures;
   removing the second mask layer exposed in the first openings and the second openings as well as a part of the first mask layer so as to form first transition holes;
   forming a filling layer in each of the first transition holes;
   removing the second mask layer and the first mask layer located between the filling layers so as to form second transition holes between adjacent filling layers, wherein projections of the second transition holes on the substrate are respectively coincident with a corresponding one of the word lines; and
   removing the first mask layer and the bit line contact layer that are exposed in each of the second transition holes, wherein a plurality of bit line contact structures arranged spaced apart from each other are formed from the remaining bit line contact layer.

14. The method for manufacturing a semiconductor structure according to claim 13, wherein the first mask layer comprises a first hard mask layer, a first silicon oxynitride layer, and a second hard mask layer stacked in sequence, and the first hard mask layer is disposed on the bit line contact layer.

15. The method for manufacturing a semiconductor structure according to claim 14, wherein forming the plurality of mask structures arranged spaced apart from each other on the second mask layer comprises:
   forming a plurality of mask blocks arranged spaced apart from each other on the second mask layer;

forming a third hard mask layer on the second mask layer located between adjacent mask blocks, wherein the third hard mask layer covers the mask blocks;

forming a photoresist layer on the third hard mask layer, wherein the photoresist layer has a plurality of third openings arranged at intervals, and a projection of each of the third openings on the third hard mask layer is located within each of the mask blocks; and removing the third hard mask layer and the mask blocks that are exposed in the third openings, wherein a plurality of T-shaped mask blocks are formed from the remaining third hard mask layer, mask strips are formed from each of the remaining mask blocks which are respectively located on both sides of a vertical section of each of the T-shaped mask block, and each of the T-shaped mask blocks and the mask strips connected to the T-shaped mask block constitute one of the mask structures.

16. The method for manufacturing a semiconductor structure according to claim 15, wherein forming the second opening in each of the mask structures comprises:

removing the T-shaped mask block, and remaining the two mask strips located on both sides of the vertical section of the T-shaped mask block, wherein the second opening is formed between the mask strips.

17. The method for manufacturing a semiconductor structure according to claim 16, wherein forming the filling layers in the first transition holes comprises:

forming an initial filling layer in the first transition holes, wherein the initial filling layer covers the mask protrusions; and back etching the initial filling layer and remaining the initial filling layer located in the first transition holes, wherein the remaining initial filling layer constitutes filling layers.

18. The method for manufacturing a semiconductor structure according to claim 17, wherein top surfaces of the filling layers are flush with top surfaces of the mask protrusions, and a material of the filling layers comprises silicon oxide.

19. The method for manufacturing a semiconductor structure according to claim 13, wherein the bit line contact layer comprises a barrier layer, a conductive layer, and an insulating layer stacked in sequence, and the barrier layer is provided on the substrate.

\* \* \* \* \*